(12) United States Patent
Barwicz et al.

(10) Patent No.: US 9,706,670 B1
(45) Date of Patent: Jul. 11, 2017

(54) CONNECTING MID-BOARD ELECTRONIC DEVICES

(71) Applicant: International Business Machines Corporation, Armonk, NY (US)

(72) Inventors: Tymon Barwicz, Yorktown Heights, NY (US); Jerome Bougie, Bromont (CA); Paul Francis Fortier, Richelieu (CA); Alexander Janta-Polczynski, Shefford (CA); Stephan L. Martel, Bromont (CA)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 14/985,503

(22) Filed: Dec. 31, 2015

(51) Int. Cl.
| | |
|---|---|
| *G02B 6/42* | (2006.01) |
| *G02B 6/30* | (2006.01) |
| *G02B 6/38* | (2006.01) |
| *G01R 31/26* | (2014.01) |
| *H05K 5/00* | (2006.01) |
| *H05K 7/20* | (2006.01) |
| *H01L 21/48* | (2006.01) |

(52) U.S. Cl.
CPC ............. *H05K 5/0004* (2013.01); *G02B 6/30* (2013.01); *G02B 6/3887* (2013.01); *G02B 6/426* (2013.01); *G02B 6/428* (2013.01); *G02B 6/4292* (2013.01); *H01L 21/4853* (2013.01); *H05K 7/2039* (2013.01)

(58) Field of Classification Search
USPC ......... 385/88–95, 135–139, 147; 438/25–28, 438/55; 257/777, 719
See application file for complete search history.

(56) References Cited

U.S. PATENT DOCUMENTS

| | | | |
|---|---|---|---|
| 6,521,989 B2 | 2/2003 | Zhou | |
| 6,660,548 B2* | 12/2003 | Naydenkov | ........ G02B 6/12007 438/26 |
| 6,945,709 B2 | 9/2005 | Steijer et al. | |
| 7,345,316 B2 | 3/2008 | Sherrer et al. | |

(Continued)

FOREIGN PATENT DOCUMENTS

| | | |
|---|---|---|
| JP | 2012230319 | 11/2012 |
| JP | 2015513125 | 4/2015 |
| WO | 2014120588 | 8/2014 |

OTHER PUBLICATIONS

Wikipedia, "Optical Fiber Connector", https://en.wikipedia.org/wiki/Optical_fiber_connector, last visited on Jan. 14, 2016, pp. 1-11.

(Continued)

*Primary Examiner* — Akm Enayet Ullah
(74) *Attorney, Agent, or Firm* — Fleit Gibbons Gutman Bongini Bianco PL; Gary Winer

(57) ABSTRACT

A micro-electronic cover has a planar portion sized and dimensioned to be positionable over and cover electronic components that are electrically connected on a board. The cover has a peripheral edge surrounding the planar portion and the electronic components. The peripheral edge connects the planar portion with the board to define a cover interior. The peripheral edge includes a side opening which provides access for passage of a connector part from a exterior to the cover to a position within the cover interior.

20 Claims, 3 Drawing Sheets

(56) References Cited

U.S. PATENT DOCUMENTS

| | | | |
|---|---|---|---|
| 7,364,684 B2* | 4/2008 | Brandenburg | B29C 45/14655 257/E23.092 |
| 7,452,140 B2 | 11/2008 | Ito et al. | |
| 8,534,927 B1 | 9/2013 | Barwicz et al. | |
| 8,545,108 B1 | 10/2013 | Barwicz et al. | |
| 8,783,911 B2* | 7/2014 | Wu | F21V 29/70 362/249.02 |
| 9,482,820 B1* | 11/2016 | Barwicz | G02B 6/30 |
| 2002/0191895 A1* | 12/2002 | Hatam-Tabrizi | G02B 6/3572 385/16 |
| 2005/0111781 A1* | 5/2005 | Jain | G02B 6/43 385/15 |
| 2007/0258683 A1 | 11/2007 | Rolston et al. | |
| 2009/0245736 A1 | 10/2009 | Ahadian et al. | |
| 2013/0114924 A1* | 5/2013 | Loh | G02B 6/1245 385/14 |
| 2013/0215613 A1* | 8/2013 | Wu | F21V 29/70 362/249.02 |
| 2014/0270652 A1 | 9/2014 | Barwicz et al. | |
| 2014/0270784 A1* | 9/2014 | Thacker | G02B 6/4284 398/115 |

OTHER PUBLICATIONS

U.S. Appl. No. 14/870,176, filed Sep. 30, 2015.

\* cited by examiner

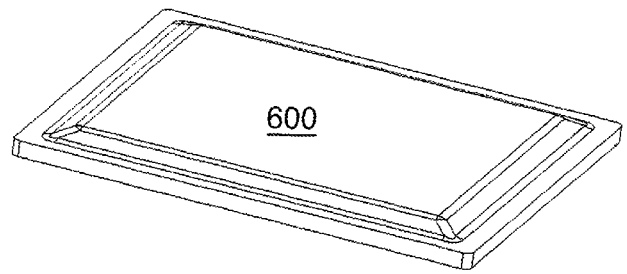
FIG. 1 - PRIOR ART
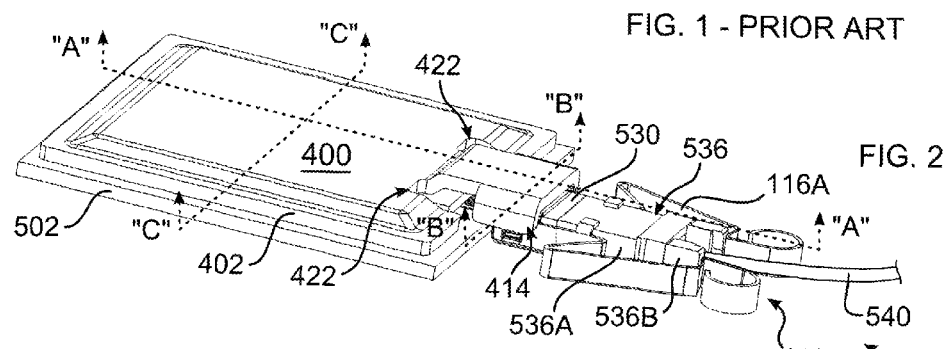
FIG. 2
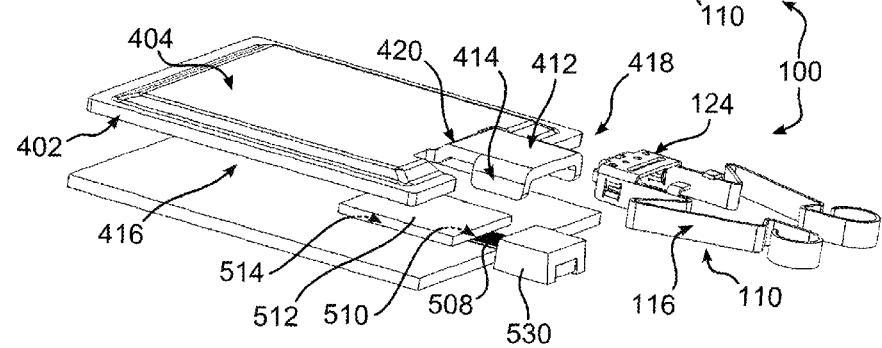
FIG. 3
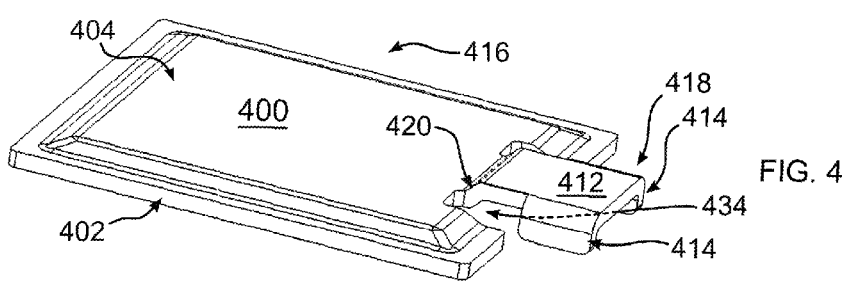
FIG. 4

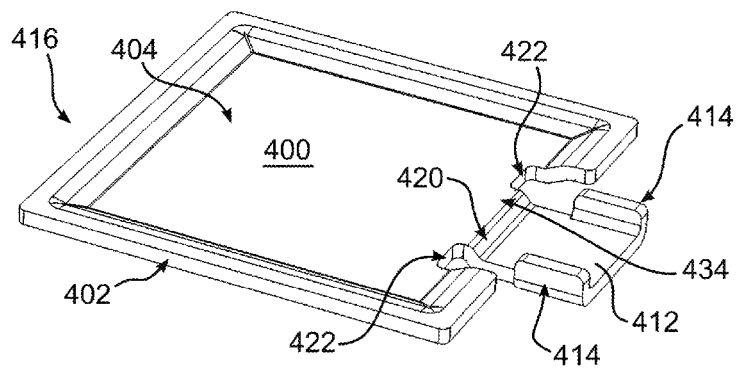
FIG. 5
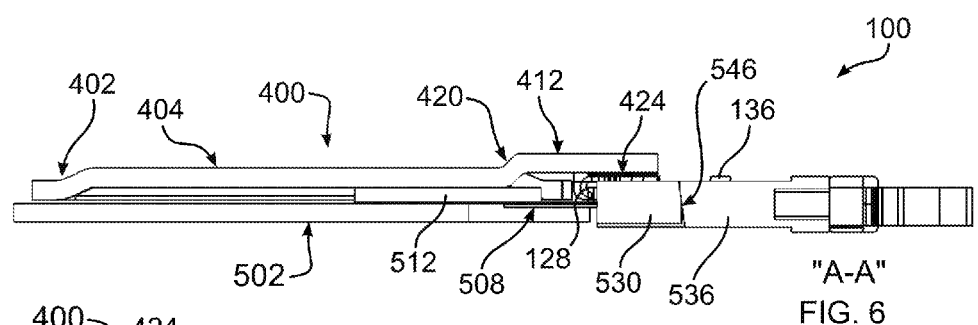
FIG. 6 "A-A"
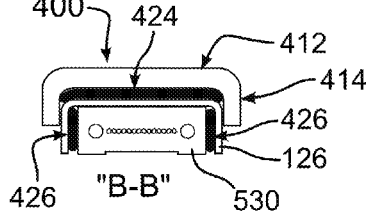
FIG. 7 "B-B"
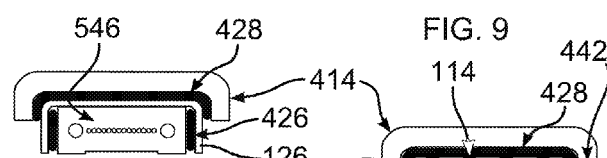
FIG. 8    FIG. 9
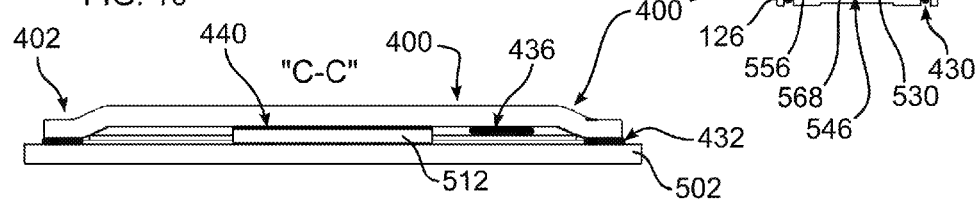
FIG. 10 "C-C"

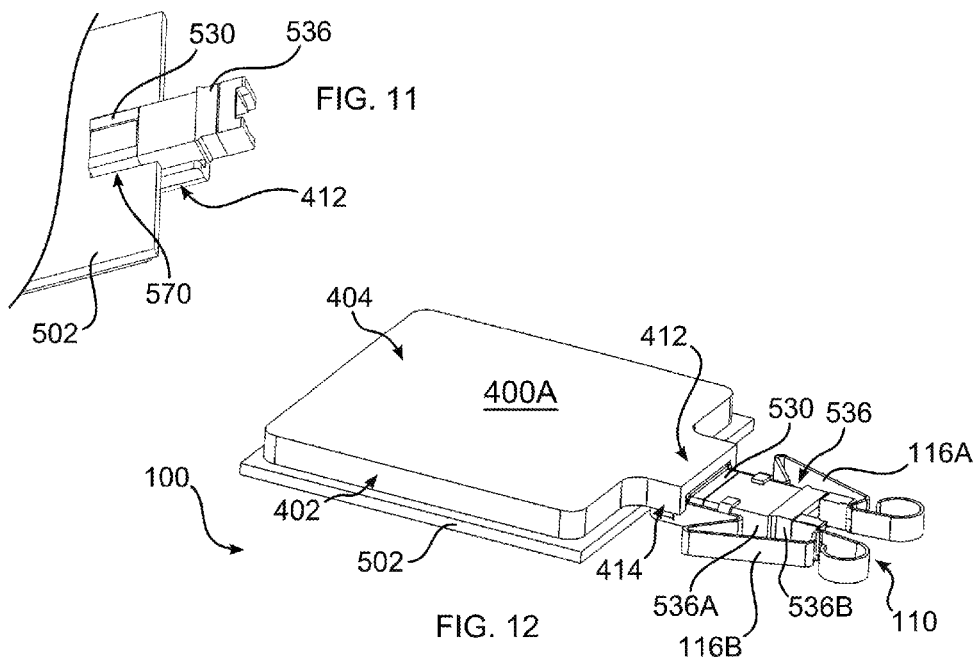
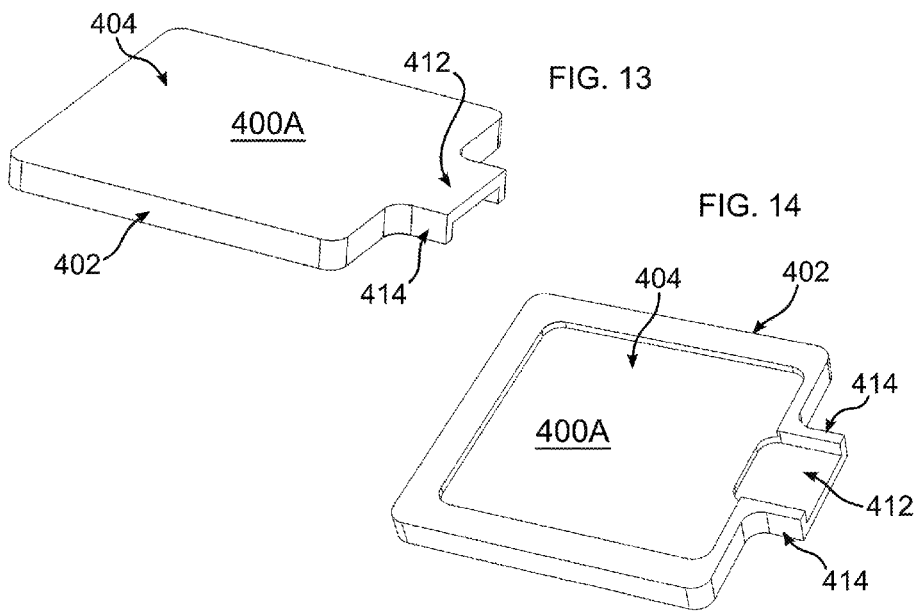

CONNECTING MID-BOARD ELECTRONIC DEVICES

FIELD OF THE DISCLOSURE

The present disclosure generally relates to connecting mid-board electronic devices, and more particularly to a micro-electronic cover which provides access and strain relief.

BACKGROUND OF THE DISCLOSURE

Mid board optical modules (MBOs) enable moving optical I/O connections from a system faceplate directly onto a printed circuit board (PCB), enabling higher throughput.

US CONEC of North Carolina, USA, manufactures "durable, composite, Polyphenylene Sulfide (PPS) based thermoplastic ferrules available with up to 72 fiber holes that terminate 125 micrometer optical fiber. The alignment mechanism consists of two stainless steel guide pins that fit into precisely molded alignment holes. The ferrules are used in conjunction with US Conec's industry hailed, MTP® brand, MPO type connectors; however, they are also suitable for custom designed passive or active fiber coupling packages. Fiber is secured to the ferrules with an optical connector grade thermal cure epoxy and can be polished with a variety of commercially available batch connector polishing machines."

US CONEC additionally manufactures connector housings that provide quick connection for up to 72 optical fibers. Connection integrity is provided by adapter latches which are locked into place on the connector plug by a spring loaded sliding and locking mechanism. Precision alignment is achieved with guide pins combined with the tightly controlled guide pin holes on MT ferrules. Removable housings allow for quick change of gender, interferometry or connector re-polishing. US Conec's MTP brand connector components are fully compliant with IEC Standard 61754-7 and TIA 604-5—Type MPO." If the connector is latched to the adapter, the ferrule endface may be cleaned through the opposite side of the adapter. A connector not attached to an adapter may also be easily cleaned with the housing in place. (see http://www.usconec.com).

A thermal heat sink can have the form of a cover which protects underlying electronic components, and which captures the heat generated by an electronic component to control the temperature of the component. The transferred heat is passed from the heat sink to a coolant or air in motion, cooling the electronic device to which the heat sink is attached. Thermal adhesive or thermal grease helps to fill air gaps between the heat sink and the electronic device. The most common heat sink materials are aluminum or copper alloys.

SUMMARY OF THE DISCLOSURE

In an embodiment of the disclosure, a micro-electronic cover for a board having electrically connected electronic components which can include photonic components, comprises a planar portion sized and dimensioned to be positionable over and cover the electronic components on the board; a peripheral edge surrounding the planar portion and the electronic components, the peripheral edge connecting the planar portion with the board to define a cover interior, the peripheral edge including a side opening providing access for passage of a connector element from a position exterior to the cover interior to a position within the cover interior; and a brace connected to the planar portion and positioned proximate the side opening and extending away from the peripheral edge.

In another embodiment of the disclosure, a photonic module compatible with surface mounting on a printed circuit board comprises a laminate with electrical connections on each of two opposing sides with electrical routing between the electrical connections; a photonic die flip-chip mounted on the laminate and electrically connected to the electrical connections on one of the two opposing sides of the laminate; a first fiber optic ferrule mating portion optically connected to the photonic die through an optical link; a micro-electronic cover comprising: a planar portion sized and dimensioned to be positionable over and cover the laminate; and a peripheral edge surrounding the planar portion and the laminate, the peripheral edge connecting the planar portion with a circuit board to define a cover interior, the peripheral edge including a side opening providing access for passage of a connector element from a position exterior to the cover interior to a position within the cover interior; a brace connected to the planar portion and positioned proximate the side opening and extending away from the peripheral edge; and a clip affixed to the first fiber optic ferrule portion and the cover, the clip sized and dimensioned to secure a mating connection between the first fiber optic ferrule portion and a second fiber optic ferrule portion including a fiber optic cable when a second fiber optic ferrule portion is mated to the first fiber optic ferrule portion.

In a further embodiment of the disclosure, a method of securing a connector portion to a photonic device, comprises connecting a photonic die to a laminate; attaching a clip to a connector portion; attaching the clip and connector portion to the photonic die; and securing a micro-electronic cover to the clip and photonic die, the cover including a planar portion sized and dimensioned to be positionable over and cover the photonic die, the cover including a peripheral edge surrounding the planar portion and the photonic die, the peripheral edge connecting the planar portion with an underlying circuit board to define a cover interior, the peripheral edge forming a gap through which a connection can be made between the photonic die and the connector portion.

BRIEF DESCRIPTION OF THE DRAWINGS

Reference may be had to the accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIG. 1 depicts a prior art cover;

FIG. 2 depicts an assembly including cover of the disclosure including a clip extension for retaining a clip;

FIG. 3 depicts an exploded view of the assembly of FIG. 2;

FIG. 4 depicts a top perspective view of the cover of FIG. 2;

FIG. 5 depicts a bottom perspective view of the cover of FIG. 2;

FIG. 6 depicts a cross-section view of the assembly of FIG. 2 taken through line A-A;

FIG. 7 depicts a cross-section view of the assembly of FIG. 2 taken through line B-B;

FIG. 8 depicts an alternative form of a cover of the disclosure and adhesive connections, relative to the cross-section taken through line B-B;

FIG. 9 depicts another alternative form of a cover of the disclosure and adhesive connections, relative to the cross-section taken through line B-B;

FIG. 10 depicts a cross-section view of the assembly of FIG. 2 taken through line C-C;

FIG. 11 depicts a perspective view of an alternative board and connector configuration of the disclosure;

FIG. 12 depicts a perspective view of an assembly and alternative cover of the disclosure;

FIG. 13 depicts a top perspective view of the cover of FIG. 12; and

FIG. 14 depicts a bottom perspective view of the cover of FIG. 12.

DETAILED DESCRIPTION OF THE DISCLOSURE

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected," although not necessarily directly, and not necessarily mechanically.

With reference to the figures, the disclosure provides a novel connection for securing connections to a printed circuit board (PCB), and particularly for the assembly of microelectronic, optoelectronic and photonic components. A connection system 100 of the disclosure provides for securing and preventing separation of a connection between two or more components, for example mating ferrule halves, as well as providing strain relief and resistance to out of plane misalignment. System 100 can further be provided with a maximum vertical dimension "V" that is not substantially greater than a vertical dimension of the components that system 100 is securing.

With reference to FIG. 1, an example of a prior art microelectronic coverplate, lid, or cover 600 is shown, and which is typically formed of metal or other heat conducting material. As such, cover 600 serves as a heat sink, to absorb heat generated by the underlying electronic components, and to spread the heat over the surface area of the cover 600, where it may be dissipated into the environment to help prevent overheating of the underlying components. In addition, cover 600 provides for mechanical protection of the underlying components, and can contribute to achieving a device coplanarity specification required for further assembly steps.

With reference to FIGS. 2-5, a cover sidewall 402 joins to planar portion 404 to form a protected interior space for containing electronic components, including photonic device 512. Cover 400 includes a mechanical stabilization component which can be combined with a material of high thermal conductivity. More particularly, cover 400 can be formed of metal or another material, advantageously having a high thermal conductivity where heat dissipation is required. Examples include aluminum alloys, such as aluminum alloy 1050A, 6061, and 6063; copper or a copper alloy, such as copper-tungsten or a copper-silver alloy matrix; a silicon carbide in an aluminum matrix; and beryllium oxide in beryllium matrix. In embodiments, cover 400 is molded over the underlying components, or includes a moldable material, to encapsulate and further protect the underlying device. Sidewall 402 can be formed of a different material than planar portion 404.

In FIGS. 2-3, a system 100 of the disclosure is illustrated, in which a microelectronic coverplate, lid, or cover 400 of the disclosure is positioned over a photonic device 512 and any associated components, and also covers a portion of board 502. While a photonic device 512 and laminate 502 are shown and described as an example, for ease of understanding, it should be understood that cover 400 can be used together with any electronic or photonic device, and any type of substrate, including a laminate or circuit board of any type.

Electrical connections between underlying devices, such as photonic die 512 and laminate 502, can be formed for example with a flip-chip interface 514, whereby photonic device 512 is electrically connected on its device side, which is facing downward in the depiction, and can therefore be covered over its top and all sides by cover 400. In addition, electrical connection on the underside of laminate 502 can further route the electrical signals to a printed circuit board. The electrical connections between a laminate and a printed circuit board can employ a ball grid array (BGA) or a land grid array (LGA) as known to those of skill in the art. In other embodiments, cover 400 can extend beyond electrical bonds extending laterally to heat producing components. In further embodiments, cover 400 does not cover the sides of the heat generating components, and contacts such components only on a top surface of the components. In accordance with the disclosure, as described further herein, cover 400 covers some components, and exposes elements to enable an electrical or optical connection.

While an MT style or other style ferrule 530/536 is described herein, the system 100 of the disclosure can be used to stabilize and secure a wide variety of electrical or optical ferrules which are currently known or are hereinafter developed, as will be explained further elsewhere herein. While the disclosure illustrates mating optical ferrules, system 100 can be used to secure connections relying on electron flow in a similar manner.

With further reference to FIGS. 2-3, an MT style ferrule termination is illustrated, which includes mating halves 530/536 which are mutually connectable to enable transmission of a light encoded signal therethrough. The ferrule halves 530 and 536 include light guiding structures which are not detailed herein, but which are well known, and which transfer light from a fiber optic cable 540 (FIG. 2) to light guiding structures in the chip device. Other styles of ferrules exist or are to be developed which can also be used in accordance with the disclosure, as will be understood in view of the disclosure.

In many applications of board 502, it is desired to place boards in close overlying conformity to one another, or to otherwise install board 502 in a location where vertical clearance is extremely limited. The disclosure provides for forming and securing a connection between mating connector portions, without increasing a height of the connection, and without requiring a housing/jacket for the connection.

All of the cover 400 and underlying devices can be assembled together during manufacturing processing using any high throughput automated standard pick and place tool such as are used in the microelectronic industry, referred to hereinafter as a pick and place system.

Clip 110 provides resistance to unintended disconnection, pullout, or separation of ferrules 530, 536. However, clip 110 should be considered illustrative, and other forms of clips can be used in accordance with the disclosure. Clip 110 engages two mating connector portions using one or more arms 116, in the example illustration the mating connector portions are fixed ferrule 530 and cable-side ferrule 536, and urges them together in mating conformity. A base plate 124 of clip 110 attaches to a connector portion, in this example fixed ferrule 530, and arms 116 are attached to and extend from plate 124.

The attachment of clip 110 to board 502 is advantageously sufficiently strong to withstand the pulling force required to install and ensure a secure connection of clip 110 onto cable ferrule 536. The connection between fixed ferrule 530 and the photonic device can be fragile, for example it can include a glued interface connection which should not be unduly stressed. This is true for many types of connectors.

To transfer pullout forces to more durable components, cover 400 functions as strain relief. As can additionally be seen in FIGS. 2-5, cover 400 is formed with an overhanging support clip support 412 which extends from planar portion 404, and forms a side opening 434. In an embodiment, clip support 412 is formed integrally with cover 400, reducing part count and assembly steps, and increasing reliability. However, clip support 412 can be separately attached to cover 400 by any means, including soldering, brazing, adhesive, or fasteners. In the embodiment of FIGS. 16-19, it may be seen that cover 400 can be formed by stamping, including for example progressive stamping from a continuous feed supply of sheet material. A peripheral outline of cover 400, as well as notches 422, can be cut before, during, or after the stamping process. Cover 400 can also be formed by bending, for example. Side opening 434 enables passage of connections or components from under cover 400 to an exterior of cover 400.

Clip support 412 can be sized and shaped to enable a structural link for connection to plate 124 or any other portion of clip 110, and forms a supporting surface for clip 110. Additional support can be provided by including one or more side tabs or faces 414 which extend downwards to overlie clip side walls, thereby increasing an overlap area with clip 110 and fixed ferrule 530. Dimensions of clip support 412 and faces 414 correspond to component and assembly tolerance for a particular application. Adhesive 424 can be interposed between clip support 412 and clip 110. Adhesive 424 can fill and flow through apertures 114 within clip plate 124 to contact fixed ferrule 530, creating a rigid bond between and among fixed ferrule 530, clip 110, and cover 400, completing a structural link among them.

Cover 400 is in contact with at least one photonic device 512, and attached laminate board 502, at a board end 416, and is also attached to and overlying clip 110 and fixed ferrule 530 at lid end 418. Cover 400 thereby acts as a strain relief for forces imparted to clip 110 and ferrule portions 530 and 536, protecting the sensitive connecting area on photonic device 512, including the optical link 508. Such forces can increase, for example, when cable ferrule 536 is connected to fixed ferrule 530, and when clip 110 is connected to cable ferrule 536. Strain can additionally be imparted to clip 110 and ferrule portions 530, 536 when a cable connected to cable ferrule 536 is pulled. If not for strain relief as described herein, such forces could be imparted to optical link 508 or to associated optical fibers or a polymer ribbon, which can be particularly fragile. Cover 400 can be efficiently positioned upon, and fastened to, board 502, photonic device 512, and clip 110 using a pick and place system, during the manufacture of system 100.

A bend offset 420 can be stamped or otherwise formed in cover 400 to position clip support 412 in overlying proximity to plate 124 or other portion of clip 110, including for example arms 116A, 116B. In an embodiment, offset 420 is only as deep as needed, if at all, to carry out this overlying configuration, in order to maintain an overall height profile of system 100 as small as possible, while still able to accommodate the dimensions of an optical component, such as fixed ferrule 530, within a final module assembly of system 100. For example, plate 400 can add only the thickness of the material of clip support 412, plus the thickness of adhesive layer 424 interposed between clip 110 and clip support 412, if applied. Similarly, notches 422 cooperate to ease bend 420 and the removal of side surfaces of cover 400 to create an opening through which optical link 508 can pass, along with some or all of fixed ferrule 530 or other connector part, if a connector part is to be positioned partly or wholly within board 502 and under cover 400. In one embodiment a cut-out in board 502 can be employed to provide clearance for ferrule 530.

FIG. 6 is a cross-section taken along line A-A of FIG. 2, illustrating a location of a layer of adhesive 424 operative to connect cover 400 to clip 110. The adhesive can be any material known in the art which can securely bond cover 400 and clip 110 and fixed ferrule 530 or other connector portion. It is advantageous for all components, including the adhesive, to have similar thermal expansion properties, to reduce the possibility of adhesive failure due to stress imposed by differential expansion, particularly as temperature or humidity changes can be significant for the photonic device 512, and other components on board 502 which may be cooled by cover 400. Adhesives described herein are further selected to provide a desired extent of rigidity/flexibility to best protect components from shock and differential thermal expansion, while reliably securing the adhered parts relative to each other, as described. Other methods of attaching cover 400 to fixed ferrule 530 through clip 110 can be used, including soldering or brazing, crimping, or using fasteners.

FIG. 7 is a cross-section taken along line B-B of FIG. 2, illustrating the placement of adhesive 424. Additionally, adhesive 426 may flow from 424 or be placed between sidewalls 126 of clip 110 and side walls of fixed ferrule 530, and can further engage other structures associated with clip 110 and fixed ferrule 530. Clip apertures 114 further help to create links between fixed ferrule 530 and cover plate 400. Apertures 114 can additionally direct adhesive to flow away from the front, or optical face 546, of fixed ferrule 530.

FIG. 8 illustrates an alternative placement of adhesive, including adhesive 428 which is positioned similarly to brace adhesive 424, but clip support 412 is formed to be wider, producing a space between side faces 414 and sidewalls 126 of clip 110, which is filled with adhesive 428. In a further alternative placement of adhesive, shown in FIG. 9, adhesive 430 is placed between plate 124 of clip 110, as well as between sidewalls 126 of clip 110 and fixed ferrule 530. While adhesives 424/426 and 428/426 are illustrated separately for clarity, during production, a single application of adhesive can be caused to flow through apertures 114 (FIG. 9) of clip 110 to lie at the locations indicated by 424, 428, and 426.

As can further be seen in FIG. 9, apertures 114 in plate 124 allow adhesive to flow through plate 124, to link cover clip support 412 and fixed ferrule 530 through plate 124. Accordingly adhesive can flow from clip support 412 to fixed ferrule 530. In an embodiment, clip support 412 is provided with one or more channels or apertures 442 (FIG. 9) along faces 414, for enabling and guiding a flow of excess adhesive, to protect fixed ferrule 530 optical face 546. Excessive adhesive can therefore flow from a space between fixed ferrule 530 and clip 110 to a space between clip 110 and an interior side of clip support 412 and be redirected by cover apertures 442 or inner grooves to limit the overflow from moving in a direction of the optical face.

FIGS. 7-9 further illustrate embedded optical links 568 within fixed ferrule 530, as well as apertures 556, which mate with corresponding alignment pins (not shown) of a mating ferrule half.

FIG. 10 is a cross-section taken along line C-C of FIG. 2, illustrating a location of adhesive 432 along a periphery of cover 400, which secures cover 400 to board 502, thereby completing a connection from fixed ferrule 530 through adhesive 426 or 430 to clip 110, through adhesive 424 or 428 to clip support 412, and finally through adhesive 432 to board 502, securely bonding fixed ferrule 530 to board 502.

As further illustrated in FIG. 10, adhesive 436 can be applied in other locations where cover 400 is advantageously secured to a component or to board 502. Adhesive 432 and 436 can further be selected to include a material which readily transfers heat from a heat generating component into cover 400 for dissipation. Similarly, thermal adhesive or thermal grease 440 is provided between photonic device 512 and cover 400, and other devices can used thermal or structural adhesive in connection with cover 400, to meet performance objectives or other specification.

While illustrated in cross-section, it should be understood that adhesive 424, 426, 428, and 430, 432, 436, and 440 can be similar or different to each other, and can extend completely throughout overlapping portions of the components adhered together, or only along portions of overlapping components, as determined by the requisite adhesion strength, thermal transfer requirements, cost considerations, and difficulty of applying the adhesive or thermal transfer material. An additional consideration is the potential for adhesive to flow before curing, to flow away from a location of application as parts are pressed into place, or to flow with the application of heat or heat ramp, whereby the adhesive could interfere with operation of the circuit or fiber optic connection or clip 110. Accordingly, sufficient space is provided in consideration of such anticipated flow. Additionally, adhesive can be applied to only one side, or two or more sides of an object.

As shown in FIG. 11, an opening, recess or cutout 570 can be provided in laminate 502, sized to accommodate displacement of fixed ferrule 530 entirely under cover 400, where it may be adhered to cover 400 and/or clip support 412. Cutout 570 may be required if the optical links are thicker than the electrical links between the photonic side and the laminate, and/or for assembly flow requirements, as described in U.S. Patent Publications 2014/0177222 and 2014/0179034. Positioned in this manner, cable-side ferrule 536 can be passed through side opening 434 of cover 400 to connect with fixed ferrule 530. Alternatively, rather than forming a cutout 570, fixed ferrule can be positioned on top of laminate 502, and cover 400 and clip support 412 can provide sufficient clearance to accommodate a dimension of fixed ferrule 530. It should also be noted that while cover 400 is shown adhered to laminate 502 in FIG. 10, cover 400 can alternatively be supported on posts, blocks, or other structures, depending on the components upon laminate 502 or other packaging requirements. Whether positioned within cutout 570, or positioned above laminate 502, fixed ferrule 530 can be adhered or otherwise bonded directly to laminate 502.

In an embodiment, cover 400 and clip 110 can be stamped from a single plate or unitary part of monolithic or composite material. In such a configuration, adhesive 424 may not be needed. However, a typical assembly flow includes connecting the photonic chip or die 516 to board 402, attaching clip 110 to fixed ferrule 530, attaching the clip/ferrule assembly to die 516, and securing cover 400 to die 516 or a photonic device connected to die 516, and to clip 110 and fixed ferrule 530. An alternate assembly flow includes connecting the photonic chip or die 516 to board 402, attaching the ferrule to die 516, attaching clip 110 to fixed ferrule 530, and attaching secure cover 400 to die 516 or a photonic device connected to die 516, and to clip 110 and fixed ferrule 530.

In an embodiment, cover 400 is directly attached to fixed ferrule 530 at the same time as when clip 110 is attached to fixed ferrule 530. Therefore, this assembly of 400/110/530 is connected to die 516 together.

Adhesive can be applied to components, including but not limited to board 502, photonic device 512, cover 400, clip support 412, side faces 414, clip 110, and fixed ferrule 530, prior to positioning by pick and place, or after placement. In an embodiment, clip support 412 can be sized and shaped to enable securely gripping clip 110, as shown in FIG. 7, until adhesive cures or adhesive can be applied. Clip support 412 or side faces 414 can further be provided with mating extensions (not shown) which engage indented or shaped portions of clip 110 for this purpose.

With reference to FIGS. 12-14, an alternative cover 400A functions as shown and described with respect to cover 400, and is manufactured using a milling or molding process. Cover 400A can be formed of metal as described with respect to cover 400, and can be CNC milled from metal. Alternatively, cover 400A can be molded from thermally conductive plastic, which can be lighter than aluminum or other metals, and have reasonable conductivity values for the application requirements, for example a conductivity value of 50-500 W/mK, or higher. Thermally conductive plastics can include, for example, a base of crystalline or amorphous resin, or a polysulfone compound, with an additive of graphite carbon fiber (for RFI shielding) or ceramic (for electrical insulation), including for example aluminum nitride and boron nitride, or any other material. Whether metal or thermally conductive plastic, cover 400A can be attached or mold to board 502, photonic device 512 or other components, and clip 110, as described with respect to cover 400.

The disclosure provides a cover 400 which, together with ferrule portions 530, 536, clip 110, and other components of the disclosure produce a packaging solution for connecting fiber optic cables, or other data cable, to a processing board, with a minimal vertical profile.

The disclosure enables an optimal location of the ferrule portions 530, 536 on the module edge to enable data transfer through the ferrule, and for enabling cooling of this and similar higher performance devices. The control of a smaller vertical height is enabled by positioning a connector at a board edge, using access provided by a side opening 434 in cover 400. The disclosure enables positioning of ferrule optical connection portions 530, 536 at the periphery of the photonic module, while protecting the fragile fiber connection extending from fixed ferrule 530 to photonic device 512.

The disclosure further avoids a requirement for excessively large fiber optic connector housings which cannot be used with dense board 502 packaging, and which can further introduce problems of tolerance stackup, cost, and assembly complexity. Additionally, prior art housings and latches cannot be easily assembled to board 502, photonics device 512, and/or cover 400 during a pick and place manufacturing process, particularly due to tight tolerances commonly required for high density applications. Alternatively, the disclosure provides a device and method which is capable of providing a low profile releasable fiber optic connector which can be assembled using a pick and place system.

Accordingly, the disclosure enables forming and maintaining a secure connection between mating ferrule components while enabling a vertical profile that is not taller than the ferrule connection. A system 100 of the disclosure can be assembled using standard high-throughput pick and place equipment, reducing a requirement for manual assembly.

System 100 can be used to secure a connection of simplex, duplex, and ribbon ferrules, the ferrules fabricated with any material, for example stainless steel, a polymeric material, a composite material, or a ceramic material. For example, clip 110 can be shaped to extend laterally around, and to contact a trailing end shoulder of an MT, LC, SC, or MU ferrule of any known or hereinafter developed size. Clip 110 provides ready access to a face of fixed ferrule 530 for cleaning or inspection. In an embodiment, plate 124, as shown, does not obscure or cover the face of fixed ferrule 530 from access from above clip 110.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A micro-electronic cover for a board having electrically connected electronic components which can include photonic components, comprising:
   a planar portion sized and dimensioned to be positionable over and cover the electronic components on the board;
   a peripheral edge surrounding the planar portion and the electronic components, the peripheral edge connecting the planar portion with the board to define a cover interior, the peripheral edge including a side opening providing access for passage of a connector element from a position exterior to the cover interior to a position within the cover interior; and
   a brace connected to the planar portion and positioned proximate the side opening and extending away from the peripheral edge.

2. The micro-electronic cover of claim 1, wherein the cover is thermally conductive, and contacts at least one heat generating electronic component on the board to conduct heat away from the at least one heat generating electronic component.

3. The micro-electronic cover of claim 1, wherein the heat generating electronic component is a photonic device, and the connector element is a ferrule connected to the photonic device to transmit light to the photonic device.

4. The micro-electronic cover of claim 1, wherein the brace is shaped to engage and support a clip, the clip shaped to engage the connector element.

5. The micro-electronic cover of claim 1, wherein the clip is shaped to hold together two mating portions of a connector.

6. The micro-electronic cover of claim 4, wherein the connector element is a fiber optic ferrule.

7. The micro-electronic cover of claim 4, wherein the brace includes one or more apertures for admitting passage of excessive adhesive through the brace.

8. The micro-electronic cover of claim 1, wherein the cover is fabricated from metal.

9. The micro-electronic cover of claim 1, wherein the cover is stamped, formed, coined, or milled.

10. The micro-electronic cover of claim 1, wherein the cover is fabricated from a heat conducting polymer having a conductivity value of at least 50 W/mK.

11. A photonic module compatible with surface mounting on a printed circuit board, the photonic module comprising:
   a laminate with electrical connections on each of two opposing sides with electrical routing between the electrical connections;
   a photonic die flip-chip mounted on the laminate and electrically connected to the electrical connections on one of the two opposing sides of the laminate;
   a first fiber optic ferrule mating portion optically connected to the photonic die through an optical link;
   a micro-electronic cover comprising:
      a planar portion sized and dimensioned to be positionable over and cover the laminate; and
      a peripheral edge surrounding the planar portion and the laminate, the peripheral edge connecting the planar portion with a circuit board to define a cover interior, the peripheral edge including a side opening providing access for passage of a connector element from a position exterior to the cover interior to a position within the cover interior;
      a brace connected to the planar portion and positioned proximate the side opening and extending away from the peripheral edge; and
   a clip affixed to the first fiber optic ferrule portion and the cover, the clip sized and dimensioned to secure a mating connection between the first fiber optic ferrule portion and a second fiber optic ferrule portion including a fiber optic cable when a second fiber optic ferrule portion is mated to the first fiber optic ferrule portion.

12. The device of claim 11, where the laminate includes a cutout portion exposing an optical connection to the photonic die.

13. The device of claim 11, where one of the two opposing sides of the laminate is an underside, and the electrical connections on the underside are a ball grid array.

14. The device of claim 11, where the photonic die includes self-alignment grooves for aligning a connection of the optical link to the ferrule.

15. The device of claim 11, where the photonic die includes self-alignment grooves for aligning a connection of the optical link from the ferrule to the photonic die.

16. The micro-electronic cover of claim 11, wherein the brace is adhered to the clip and the clip is adhered to the first fiber optic ferrule mating portion.

17. The micro-electronic cover of claim 16, wherein the clip includes a plate, and a portion of the plate that is adhered to the brace includes one or more apertures to admit passage of adhesive through the plate into contact with the first fiber optic ferrule mating portion, the brace, clip, and connector element being thereby mutually adhered.

18. The micro-electronic cover of claim 11, the brace formed by bends and including extending faces positioned to lie proximate a surface of the clip, at least one bend positioning a clip engaging portion of the brace at an overlying orientation with respect to the clip.

19. A method of securing a connector portion to a photonic device, comprising:
- connecting a photonic die to a laminate;
- attaching a clip to a connector portion;
- attaching the clip and connector portion to the photonic die; and
- securing a micro-electronic cover to the clip and photonic die, the cover including a planar portion sized and dimensioned to be positionable over and cover the photonic die, the cover including a peripheral edge surrounding the planar portion and the photonic die, the peripheral edge connecting the planar portion with an underlying circuit board to define a cover interior, the peripheral edge forming a gap through which a connection can be made between the photonic die and the connector portion.

20. The method of claim 19, further including thermally connecting the photonic die to the micro-electronic cover.

\* \* \* \* \*